US012765142B2

(12) United States Patent
Pai et al.

(10) Patent No.: US 12,765,142 B2
(45) Date of Patent: Oct. 13, 2026

(54) DISPLAY DEVICE

(71) Applicant: AUO Corporation, Hsinchu (TW)

(72) Inventors: Chia-Hui Pai, Hsinchu (TW); Wen-Hsien Tseng, Hsinchu (TW); Chien-Hung Kuo, Hsinchu (TW)

(73) Assignee: AUO Corporation, Hsinchu City (TW)

( * ) Notice: Subject to any disclaimer, the term of this patent is extended or adjusted under 35 U.S.C. 154(b) by 782 days.

(21) Appl. No.: 18/089,563

(22) Filed: Dec. 28, 2022

(65) Prior Publication Data

US 2024/0162402 A1 May 16, 2024

(30) Foreign Application Priority Data

Nov. 11, 2022 (TW) .................................. 111143172

(51) Int. Cl.

| | |
|---|---|
| ***H10H 20/857*** | (2025.01) |
| ***H10W 72/00*** | (2026.01) |
| ***H10W 72/20*** | (2026.01) |
| ***H10W 72/30*** | (2026.01) |
| ***H10W 72/90*** | (2026.01) |
| ***H10W 90/00*** | (2026.01) |
| ***H10W 99/00*** | (2026.01) |

(52) U.S. Cl.

CPC .......... *H10H 20/857* (2025.01); *H10W 90/00* (2026.01); *H10W 72/07235* (2026.01); *H10W 72/07253* (2026.01); *H10W 72/07335* (2026.01); *H10W 72/07353* (2026.01); *H10W 72/234* (2026.01); *H10W 72/242* (2026.01); *H10W 72/334* (2026.01); *H10W 72/352* (2026.01); *H10W 72/856* (2026.01); *H10W 72/90* (2026.01); *H10W 72/9415* (2026.01); *H10W 72/952* (2026.01); *H10W 72/953* (2026.01); *H10W 90/722* (2026.01); *H10W 90/732* (2026.01); *H10W 99/00* (2026.01)

(58) Field of Classification Search

CPC .......................... H10H 20/857; H10H 20/8314

See application file for complete search history.

(56) References Cited

U.S. PATENT DOCUMENTS

| | | | | |
|---|---|---|---|---|
| 2017/0194304 A1* | 7/2017 | Takeya | ................. | H10D 86/411 |
| 2018/0122788 A1* | 5/2018 | Wu | ....................... | H01L 25/167 |
| 2022/0131057 A1* | 4/2022 | Lo | ........................ | H10H 29/142 |

FOREIGN PATENT DOCUMENTS

| | | |
|---|---|---|
| CN | 103219444 | 7/2013 |
| CN | 109473528 | 3/2019 |

(Continued)

*Primary Examiner* — Raj R Gupta
(74) *Attorney, Agent, or Firm* — JCIPRNET

(57) ABSTRACT

A display device includes a circuit substrate, a plurality of pad sets and a plurality of light-emitting elements. The plurality of pad sets is disposed on the circuit substrate, and each pad set includes a first pad and a second pad surrounding the first pad. The plurality of light-emitting elements is disposed above the circuit substrate, and each light-emitting element includes a first electrode, a second electrode and a light-emitting stack between the first electrode and the second electrode, wherein the first electrode is electrically connected to the first pad, the second electrode is electrically connected to the second pad, and an orthographic projection of the second electrode on the circuit substrate is overlapped with an orthographic projection of the first pad on the circuit substrate.

3 Claims, 12 Drawing Sheets

40

(56) References Cited

FOREIGN PATENT DOCUMENTS

| | | | | |
|---|---|---|---|---|
| CN | 110690143 | | 1/2020 | |
| CN | 113594329 | | 11/2021 | |
| CN | 114447176 | | 5/2022 | |
| DE | 112019002234 | T5 * | 1/2021 | ............ H10W 90/00 |
| TW | 202218192 | | 5/2022 | |

* cited by examiner

DISPLAY DEVICE

CROSS-REFERENCE TO RELATED APPLICATION

This application claims the priority benefit of Taiwan application serial no. 111143172, filed on Nov. 11, 2022. The entirety of the above-mentioned patent application is hereby incorporated by reference herein and made a part of this specification.

BACKGROUND

Technical Field

The disclosure relates to an optoelectronic device and, in particularly, to a display device.

Description of Related Art

Micro-LED displays have the advantages of power saving, high efficiency, high brightness and fast response time. Generally speaking, Micro-LEDs can be divided into lateral and vertical types depending on whether the two electrodes are disposed at the same side or different sides of the light-emitting stack, and the vertical type Micro-LED is expected to become the mainstream structure in the future due to its better heat dissipation and luminous efficiency.

Since the height of the vertical Micro-LED is relatively high and the two electrodes of the vertical Micro-LED are located at the upper and lower sides of the light-emitting stack, after the vertical Micro-LED has been mass transferred onto the circuit substrate and the lower electrode has been connected to the corresponding pad on the circuit substrate, it is necessary to form a planarization layer that fills up the difference in topography before the formation of a conductive layer which connects the upper electrode to another pad on the circuit substrate. However, during the formation of the planarization layer or the conductive layer, the etchant used to pattern the planarization layer or the conductive layer damages the connection between the lower electrode and the corresponding pad, resulting in poor reliability of the Micro-LED display device.

SUMMARY

The disclosure provides a display device with improved reliability.

In an embodiment of the disclosure, a display device is provided. The display device includes a circuit substrate, a plurality of pad sets and a plurality of light-emitting elements. The plurality of pad sets is disposed on the circuit substrate, and each pad set includes a first pad and a second pad surrounding the first pad. The plurality of light-emitting elements is disposed above the circuit substrate, and each light-emitting element includes a first electrode, a second electrode and a light-emitting stack between the first electrode and the second electrode. The first electrode is electrically connected to the first pad, the second electrode is electrically connected to the second pad, and an orthographic projection of the second electrode on the circuit substrate is overlapped with an orthographic projection of the first pad on the circuit substrate.

In an embodiment of the disclosure, the first electrode is disposed between the first pad and the light-emitting stack.

In an embodiment of the disclosure, the second electrode extends from a top surface of the light-emitting stack far away from the first electrode to a sidewall of the light-emitting stack.

In an embodiment of the disclosure, the second electrode is a transparent conductive layer.

In an embodiment of the disclosure, the second electrode surrounds the sidewall of the light-emitting stack.

In an embodiment of the disclosure, the display device further includes a connector disposed on the second pad, and the connector electrically connects the second electrode and the second pad.

In an embodiment of the disclosure, the display device further includes a first insulating layer disposed between the second electrode and the sidewall of the light-emitting stack.

In an embodiment of the disclosure, a dimension of the light-emitting element is greater than an inner diameter of the second pad.

In an embodiment of the disclosure, the second electrode is located only on a top surface of the light-emitting stack far away from the first electrode.

In an embodiment of the disclosure, the display device further includes a transparent conductive layer electrically connecting the second electrode and the second pad.

In an embodiment of the disclosure, the transparent conductive layer covers the second electrode, a sidewall of the light-emitting stack and the second pad.

In an embodiment of the disclosure, the transparent conductive layer further extends to a side of the second pad far away from the light-emitting element.

In an embodiment of the disclosure, the second pads of the plurality of pad sets are connected to each other.

In an embodiment of the disclosure, a dimension of the light-emitting element is greater than, equal to or less than an inner diameter of the second pad.

In an embodiment of the disclosure, maximum heights of the plurality of light-emitting elements on the circuit substrate are substantially equal.

In an embodiment of the disclosure, the display device further includes a second insulating layer disposed between the second pad the circuit substrate. The second insulating layer has a plurality of openings, and the first pads of the plurality of pad sets are disposed in the plurality of openings respectively.

In an embodiment of the disclosure, a dimension of the light-emitting element is not less than a diameter of the opening.

To make the aforementioned features and advantages of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
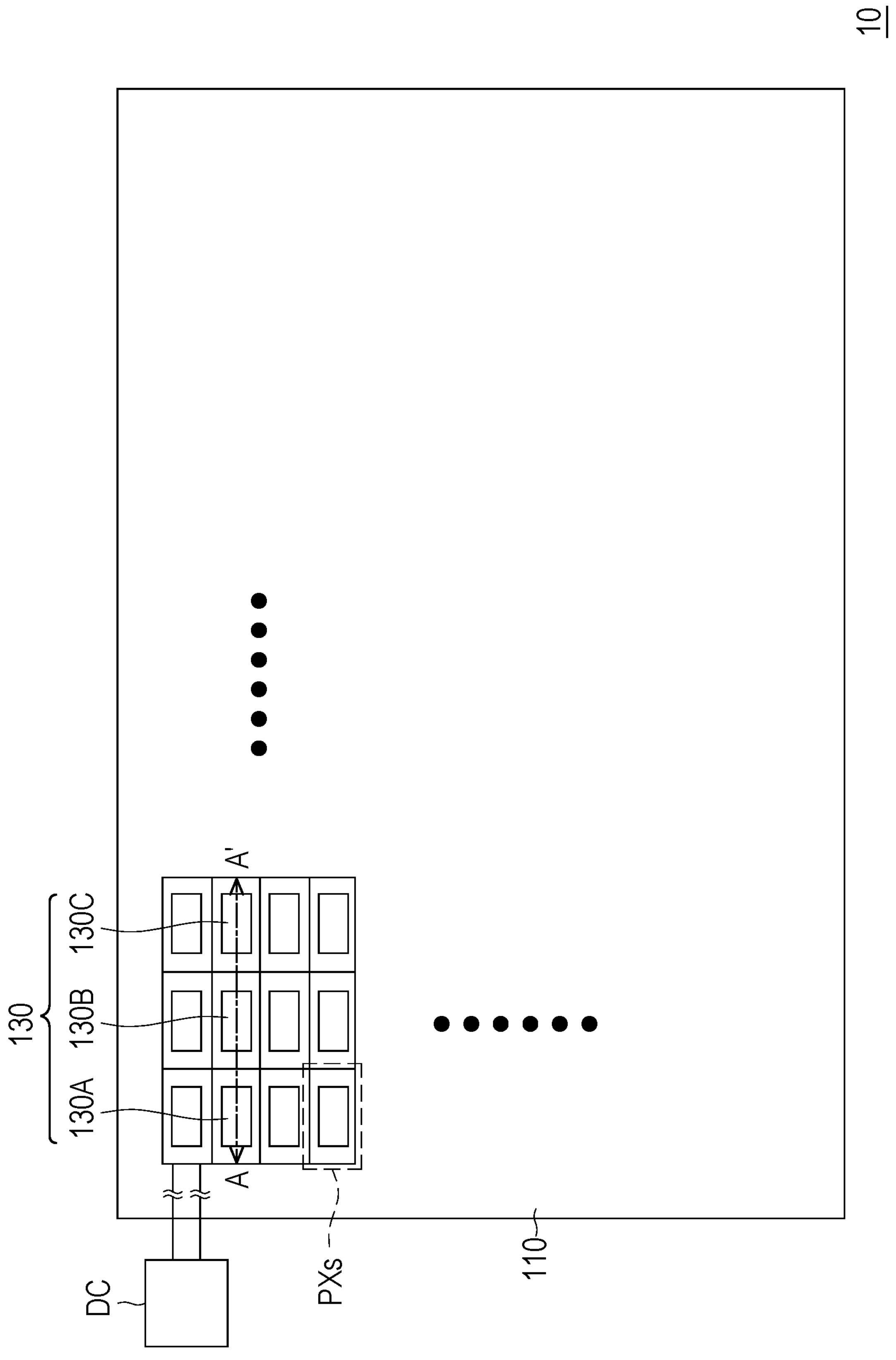
FIG. 1A is a schematic top view of a display device 10 according to an embodiment of the disclosure.

In the drawings, the thickness of layers, films, panels, regions, etc., is exaggerated for clarity. Throughout the specification, the same reference numerals represent the same elements. It should be understood that when an element such as a layer, a film, a region, or a substrate is referred to as being "on" another element or "connected to" another element, the element may be directly on the another element or connected to the another element, or there may be an intermediate element. In contrast, when an element is referred to as being "directly on" another element or "directly connected to" another element, there is no intermediate element. As used herein, "connection" may refer to physical and/or electrical connection. Furthermore, "electrical connection" or "coupling" may be that there is another element between two elements.

It should be understood that although terms such as "first", "second", and "third" may be used herein to describe various elements, components, regions, layers, and/or portions, the elements, components, regions, and/or portions are not limited by the terms. The terms are only used to distinguish one element, component, region, layer, or portion from another element, component, region, layer, or portion. Therefore, a first "element", "component", "region", "layer", or "portion" discussed below may be referred to as a second element, component, region, layer, or portion without departing from the teachings herein.

The terms used herein are only for the purpose of describing specific embodiments and are not limiting. As used herein, unless the content clearly indicates otherwise, the singular forms "a", "one", and "the" are intended to include plural forms, including "at least one" or representing "and/or". As used herein, the term "and/or" includes any and all combinations of one or more of the relevant listed items. It should also be understood that when used in the specification, the terms "containing" and/or "including" designate the presence of the feature, the region, the entirety, the step, the operation, the element, and/or the component, but do not exclude the presence or the addition of one or more other features, regions, entireties, steps, operations, elements, components, and/or combinations thereof.

In addition, relative terms such as "lower" or "bottom" and "upper" or "top" may be used herein to describe the relationship between an element and another element, as shown in the drawings. It should be understood that the relative terms are intended to include different orientations of a device in addition to the orientation shown in the drawings. For example, if the device in a drawing is flipped, an element described as being on the "lower" side of other elements will be oriented on the "upper" side of the other elements. Therefore, the exemplary term "lower" may include the orientations of "lower" and "upper", depending on the specific orientation of the drawing. Similarly, if the device in a drawing is flipped, an element described as being "under" or "below" other elements will be oriented "above" the other elements. Therefore, the exemplary term "under" or "below" may include the orientations of above and below.

Taking into account the measurement in question and the specific amount of measurement-related error (i.e., the limitations of the measurement system), "about", "similar", or "substantially" used in the present specification include the value and the average value within an acceptable deviation range of a specific value confirmed by those having ordinary skill in the art. For example, "about" may represent within one or a plurality of standard deviations of the value, or within ±30%, ±20%, ±10%, or ±5%. Moreover, "about", "similar", or "substantially" used in the present specification may include a more acceptable deviation range or standard deviation according to optical properties, etching properties, or other properties, and one standard deviation does not need to apply to all of the properties.

Unless otherwise defined, all terms (including technical and scientific terms) used herein have the same meaning as commonly understood by persons skilled in the art of the disclosure. It will be further understood that terms such as those defined in commonly used dictionaries should be interpreted as having meanings consistent with the meanings in the related art and the context of the disclosure, and will not be interpreted as having idealized or overly formal meanings unless explicitly defined herein.

The exemplary embodiments are described herein with reference to cross-sectional views that are schematic views of idealized embodiments. Therefore, changes in shapes of illustration as a result of, for example, manufacturing technology and/or tolerances may be expected. Therefore, the embodiments described herein should not be interpreted as being limited to the specific shapes of regions as shown herein, but include, for example, shape deviations caused by manufacturing. For example, a region that is shown or described as flat may generally have rough and/or non-linear features. In addition, an acute angle shown may be rounded. Therefore, the regions shown in the drawings are schematic in nature, and the shapes thereof are not intended to show the precise shapes of the regions and are not intended to limit the scope of the claims.

Figure 1B:
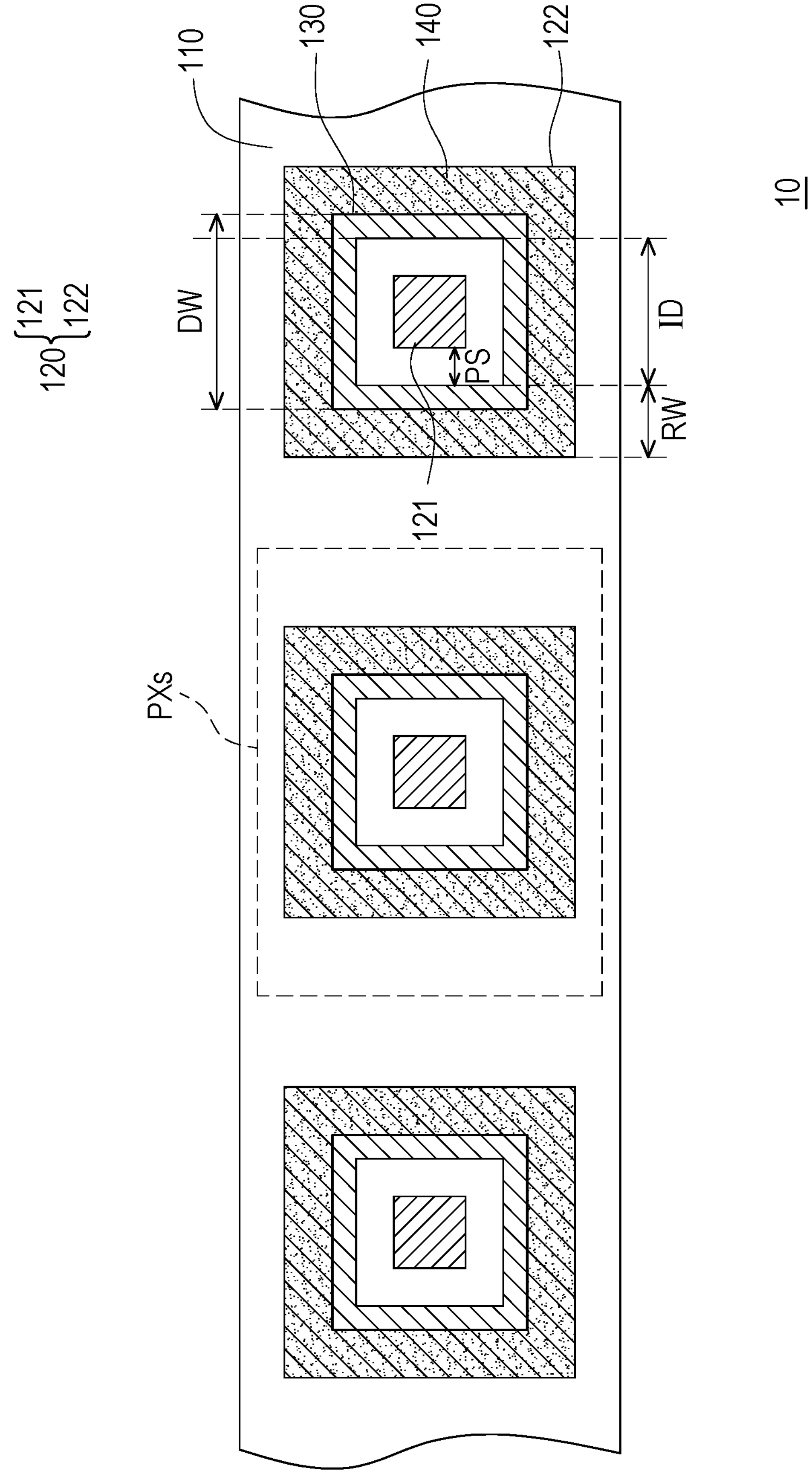
FIG. 1B is an enlarged schematic view of a plurality of sub-pixels PXs of the display device 10 in FIG. 1A.
Figure 1C:
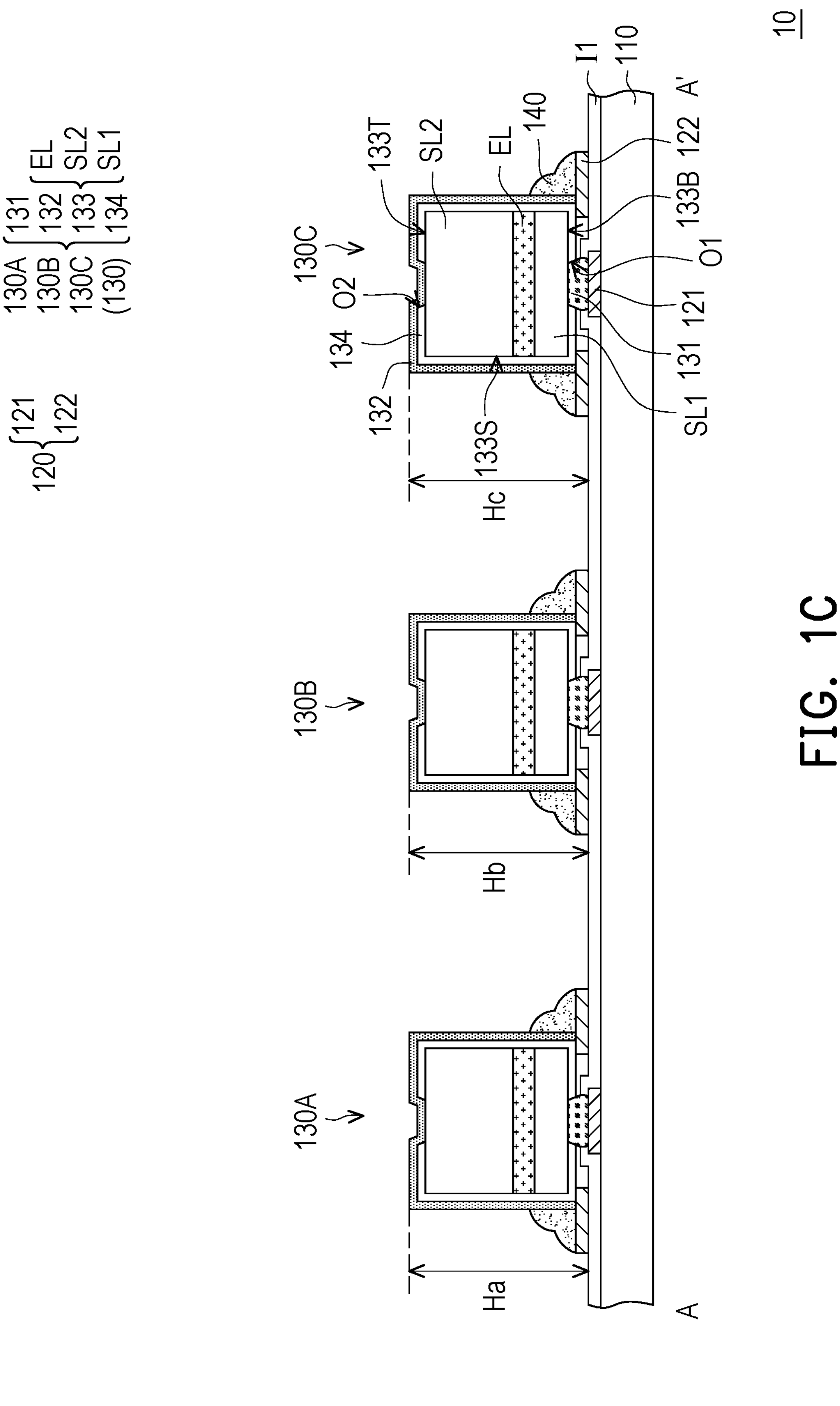
FIG. 1C is a schematic cross-sectional view taken along the section line A-A' of FIG. 1A.

FIG. 1A is a schematic top view of a display device 10 according to an embodiment of the disclosure. FIG. 1B is an enlarged schematic view of a plurality of sub-pixels PXs of the display device 10 in FIG. 1A. FIG. 1C is a schematic cross-sectional view taken along the section line A-A' of FIG. 1A. For a concise illustration of the drawings, FIG. 1A schematically shows the substrate 110, the light-emitting element 130, the sub-pixels PXs and the driving element DC of the display device 10 and omits other components.

Referring to FIG. 1A to FIG. 1C, the display device 10 includes a circuit substrate 110, a plurality of pad sets 120 and a plurality of light-emitting elements 130. The plurality of pad sets 120 is disposed on the circuit substrate 110, and each pad set 120 includes a first pad 121 and a second pad 122 surrounding the first pad 121. The plurality of light-emitting elements 130 is disposed on the circuit substrate 110, and each light-emitting element 130 includes a first electrode 131, a second electrode 132 and a light-emitting stack 133 between the first electrode 131 and the second electrode 132. The first electrode 131 is electrically connected to the first pad 121 and the second electrode 132 is electrically connected to the second pad 122.

In the display device 10 according to an embodiment of the disclosure, by making the second pad 122 surround the first pad 121, the formation of the electrical connection between the second electrode 132 and the second pad 122 need not use an etching process. Therefore, the electrical connection between the first electrode 131 and the first pad 121 can be prevented from being damaged by the etching process, thereby improving the reliability of the display device 10. With reference to FIG. 1A to FIG. 1C, the implementation of each element of the display device 10 is illustrated in the subsequent paragraphs, but the disclosure is not limited thereto. Specifically, the display device 10 may include a plurality of sub-pixels PXs, and the plural sub-pixels PXs may be arranged in an array, but the disclosure is not limited thereto. In some embodiments, the display device 10 may further include a driving element DC, and the driving element DC may be electrically connected to the sub-pixels PXs to individually control the operation of each sub-pixel PXs.

For example, each sub-pixel PXs of the display device 10 includes the circuit substrate 110, the pad set 120 and the light-emitting element 130. The pad set 120 is disposed on the surface of the circuit substrate 110, the first electrode 131 of the light-emitting element 130 is electrically connected to the first pad 121 of the pad set 120, the second electrode 132 of the light-emitting element 130 is electrically connected to the second pad 122 of the pad set 120, and the driving element DC can be electrically connected to the first pad 121 and the second pad 122 respectively. In some embodiments, the first pads 121 of plural sub-pixels PXs are separated from each other, and independently receive signals provided by the driving element DC. In some embodiments, the second pads 122 of plural sub-pixels PXs may be electrically connected to each other or be applied with the same common voltage during operation. In some embodiments, the driving element DC may be a chip bonded to the circuit substrate 110 or a circuit element (including an active element, a passive element or a combination thereof) formed directly in the circuit substrate 110.

In some embodiments, the circuit substrate 110 may include a driving circuit structure disposed on a base plate, wherein the base plate may be a transparent substrate or a non-transparent substrate, whose material may be a quartz substrate, a glass substrate, a polymer substrate or other suitable material. The driving circuit structure may include elements or circuits required by the display device 10, such as driving elements, switching elements, storage capacitors, power lines, driving signal lines, timing signal lines, current compensation lines, detection signal lines, and so on.

In some embodiments, each sub-pixel PXs may include one pad set 120, but the disclosure is not limited thereto. In certain embodiments, each sub-pixel PXs may include two or more pad sets 120. As shown in FIG. 1C, in some embodiments, the first pad 121 and the second pad 122 may belong to different film layers or be located on different planes. For example, the insulating layer I1 partially covers the first pad 121, and the second pad 122 is disposed on the insulating layer I1 to avoid electrical connection between the first pad 121 and the second pad 122. In certain embodiments, the first pads 121 and the second pads 122 may belong to the same film layer or be located on the same plane, and the patterns of the first pads 121 and the second pads 122 are separated from each other. In some embodiments, the first pad 121 and the second pad 122 have different potentials.

Referring to FIG. 1B, in some embodiments, the first pad 121 has a block conductive pattern, such as a rectangular block conductive pattern. In certain embodiments, the first pad 121 has a circular block conductive pattern. In some embodiments, the second pad 122 has a rectangular ring profile surrounding the first pad 121. In certain embodiments, the first pad 121 overlaps the center of the rectangular ring profile of the second pad 122. In some embodiments, the ring width RW of the second pad 122 ranges from 1 μm to 3 μm. In some embodiments, the spacing PS between the first pad 121 and the second pad 122 is less than half the dimension DW of the light-emitting element 130, i.e. PS<½DW.

The first pad 121 and the second pad 122 may have a single-layer structure or a multi-layer structure having stacked conductive layers. For example, the first pad 121 or the second pad 122 is a single metal layer made of metal, such as aluminum, molybdenum, titanium, copper, etc., but the disclosure is not limited thereto. In some embodiments, the first pad 121 or the second pad 122 may have a stacked structure composed of a layer of metal, such as aluminum, molybdenum, titanium or copper, and a layer of conductive oxide, such as indium tin oxide (ITO), indium zinc oxide (IZO), indium gallium zinc oxide (IGZO) or other suitable conductive oxides.

Referring to FIG. 1C, in some embodiments, the plurality of light-emitting elements 130 of the display device 10 includes a light-emitting element 130A, a light-emitting element 130B and a light-emitting element 130C, and the maximum height Ha, the maximum height Hb and the maximum height Hc of the light-emitting element 130A, the light-emitting element 130B and the light-emitting element 130C on the circuit substrate 110 are similar to each other. In some embodiments, the maximum height Ha, the maximum height Hb and the maximum height He are substantially equal to each other. In some embodiments, the light-emitting elements 130A, 130B and 130C may all be blue light-emitting diodes, and the display device 10 further includes color conversion layers (not shown) disposed respectively on the light-emitting elements 130B and 130C. The color conversion layer may include phosphors or wavelength conversion materials with similar properties so that the blue light emitted by the blue light-emitting diode is converted into light with a desired color, thereby exhibiting full-color display effect. In other embodiments, the light-emitting element 130A may be blue light-emitting diodes, the light-emitting element 130B may be red light-emitting diodes, and the light-emitting element 130C may be green light-emitting diodes for achieving full-color display effect. When the colors of light emitted by the light-emitting elements 130A, 130B and 130C are different from each other, the color conversion layers may be optional omitted or kept in the display device 10. In some embodiments, the light-emitting elements 130A, 130B and 130C may all be white light-emitting diodes, and the color conversion layers may be color filter layers to provide a full-color image display.

The first electrode 131 and the second electrode 132 of the light-emitting element 130 can be electrically connected to different layers in the light-emitting stack 133 respectively. For example, the light-emitting stack 133 may include a semiconductor layer SL1, a semiconductor layer SL2, and a light-emitting layer EL sandwiched between the semiconductor layer SL1 and the semiconductor layer SL2. The first electrode 131 may be electrically connected to the semiconductor layer SL1, and the second electrode 132 may be electrically connected to the semiconductor layer SL2. In some embodiments, the light-emitting element 130 is a vertical micro light-emitting diode.

In some embodiments, the first electrode 131 and the light-emitting stack 133 of the light-emitting element 130 are vertically arranged and stacked, and the second electrode 132 of the light-emitting element 130 surrounds the sidewall 133S of the light-emitting stack 133. In some embodiments, the second electrode 132 extends from the top surface 133T of the light-emitting stack 133 away from the first electrode 131 to the sidewall 133S of the light-emitting stack 133. In some embodiments, the second electrode 132 covers all surfaces of the light-emitting stack 133 except the bottom surface 133B. In some embodiments, the orthographic projection of the second electrode 132 on the circuit substrate 110 is overlapped with the orthographic projection of the first electrode 131 on the circuit substrate 110. In some embodiments, the orthographic projections of the first electrode 131, the second electrode 132 and the light-emitting stack 133 on the circuit substrate 110 overlap with each other.

In some embodiments, the light-emitting element 130 further includes an insulating layer 134 located between the sidewall 133S of the light-emitting stack 133 and the second electrode 132 to avoid the electrical connection between the second electrode 132 and the semiconductor layer SL1. In some embodiments, the insulating layer 134 is disposed on the sidewall 133S, the top surface 133T and the bottom surface 133B of the light-emitting stack 133. In certain embodiments, the insulating layer 134 covers all surfaces of the light-emitting stack 133 and has an opening O1 and an opening O2, wherein the opening O1 exposes the semiconductor layer SL1, the first electrode 131 is electrically connected to the semiconductor layer SL1 through the opening O1, the opening O2 exposes the semiconductor layer SL2, and the second electrode 132 is electrically connected to the semiconductor layer SL2 through the opening O2. In some embodiments, the opening O1 is adjacent to the bottom surface 133B of the light-emitting stack 133, and the opening O2 is adjacent to the top surface 133T of the light-emitting stack 133.

In some embodiments, the material of the first electrode 131 includes metal, alloy, nitride of metal material, oxide of metal material, oxynitride of metal material or other suitable materials or a stack layer of metal material and other conductive material or other low resistance material. In some embodiments, the material of the first electrode 131 includes tin (Sn), tin-lead (SnPb) alloy, bismuth-tin (BiSn) alloy and/or silver-tin (AgSn) alloy. In some embodiments, the second electrode 132 is a transparent conductive layer. In some embodiments, the material of the second electrode 132 includes indium tin oxide (InSnO), indium zinc oxide (InZnO), aluminum tin oxide (AlSnO), aluminum zinc oxide (A1ZnO), indium gallium zinc oxide (InGaZnO), nano silver or other suitable conductive oxides.

In some embodiments, the semiconductor layer SL1 is an N-type doped semiconductor layer, and the material of the N-type doped semiconductor layer is, for example, N-type gallium nitride (n-GaN). In other embodiments, the semiconductor layer SL1 may include II-VI group materials (for example, zinc selenide (ZnSe)) or nitride of III-V group materials (for example, gallium nitride (GaN), aluminum nitride (AlN), indium nitride (InN), indium gallium nitride (InGaN), aluminum gallium nitride (AlGaN) or aluminum indium gallium nitride (AlInGaN)). In some embodiments, the semiconductor layer SL2 is a P-type doped semiconductor layer, and the material of the P-type doped semiconductor layer is, for example, P-type gallium nitride (p-GaN). In other embodiments, the semiconductor layer SL2 may include II-VI group materials (for example, zinc selenide (ZnSe)) or nitride of III-V group materials (for example, gallium nitride (GaN), aluminum nitride (AlN), indium nitride (InN), indium gallium nitride (InGaN), aluminum gallium nitride (AlGaN) or aluminum indium gallium nitride (AlInGaN)). In some embodiments, the light-emitting layer EL may include II-VI group materials (such as zinc selenide (ZnSe)) or nitride of III-V group materials (such as gallium nitride (GaN), aluminum nitride (AlN), indium nitride (InN), indium gallium nitride (InGaN), aluminum gallium nitride (AlGaN) or aluminum indium gallium nitride (AlInGaN)). In some embodiments, the structure of the light-emitting layer EL is, for example, a multiple quantum well (MQW) structure. The MQW structure may include alternately stacked layers of indium gallium nitride (InGaN) and gallium nitride (GaN). By designing the proportion of indium or gallium in the light-emitting layer EL, the wavelength range of the light emitted by the light-emitting layer EL can be adjusted.

For example, the light-emitting element 130 is manufactured on a growth substrate (e.g., a sapphire substrate) and then transferred to the circuit substrate 110 through a mass transfer process, in which the first electrode 131 of the light-emitting element 130 can be transferred onto the first pad 121. In some embodiments, the first electrode 131 is located between the first pad 121 and the light-emitting stack 133. In some embodiments, the orthographic projections of the first pad 121, the first electrode 131 and the light-emitting stack 133 on the circuit substrate 110 overlap with each other. In some embodiments, the orthographic projection of the second electrode 132 on the circuit substrate 110 overlaps the orthographic projection of the first pad 121 on the circuit substrate 110. In some embodiments, the orthographic projections of the first pad 121, the first electrode 131, the light-emitting stack 133 and the second electrode 132 on the circuit substrate 110 overlap with each other. In some embodiments, the first electrode 131 can be electrically connected to the first pad 121 through metal, conductive glue or other conductive materials. In some embodiments, the dimension DW of the light-emitting element 130 is greater than the inner diameter ID of the second pad 122.

In some embodiments, the display device 10 further includes a connector 140 disposed on the second pad 122. In some embodiments, the connector 140 includes a hot melt material. Accordingly, when the second electrode 132 on the side wall 133S of the light-emitting stack 133 of the light-emitting element 130 is located on the second pad 122, the connector 140 on the second pad 122 can electrically connect the second pad 122 to the second electrode 132 after heat treatment. In some embodiments, the connector 140 surrounds the light-emitting element 130. In some embodiments, the orthographic projection of the connector 140 on the circuit substrate 110 is outside the orthographic projection of the second electrode 132 on the circuit substrate 110. In some embodiments, the material of the connector 140 includes tin (Sn), tin-lead (SnPb) alloy, bismuth-tin (BiSn) alloy, silver-tin (AgSn) alloy or other solders.

In the subsequent paragraphs, other embodiments of the disclosure are further illustrated with reference to FIG. 1D to FIG. 7. Reference numerals and relevant content of the elements of the embodiments of FIG. 1A to FIG. 1C are used in the illustration, the same reference numerals are used to denote the same or similar elements, and the illustration of the same technical content is omitted. For the omitted illustration, refer to the embodiments of FIG. 1A to FIG. 1C, which is not repeated hereinafter.

Figure 1D:
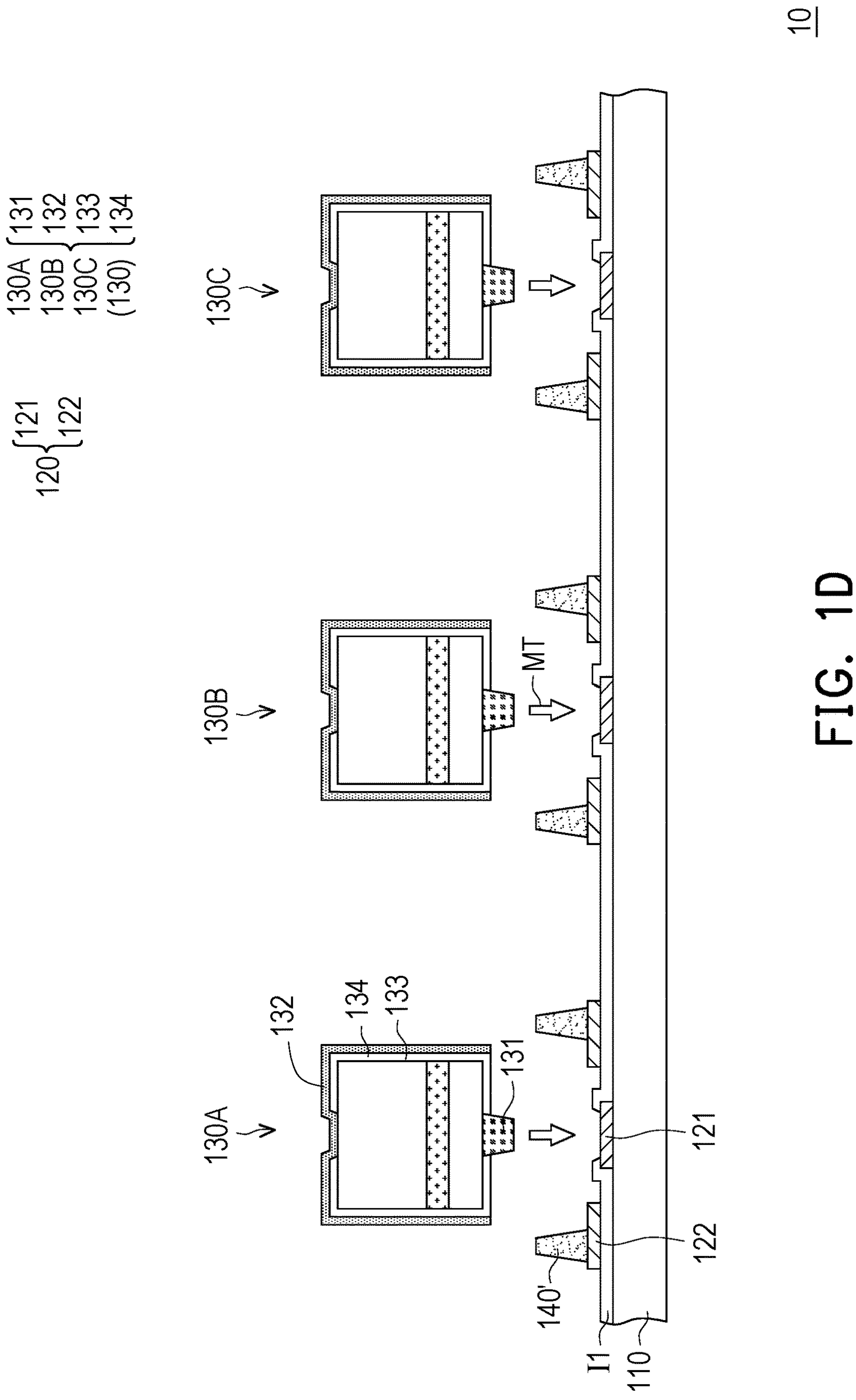
FIG. 1D is a schematic partial cross-sectional view of the step flow of the manufacturing method of the display device 10 according to an embodiment of the disclosure.

FIG. 1D is a schematic partial cross-sectional view of the step flow of the manufacturing method of the display device 10 according to an embodiment of the disclosure. Hereinafter, a manufacturing method of the display device 10 will be described with reference to FIG. 1C and FIG. 1D.

With reference to FIG. 1D, in some embodiments, a circuit substrate 110 is provided, and a first pad 121, an insulating layer I1 partially covering the first pad 121, a second pad 122 disposed on the insulating layer I1 and a connection pattern 140' on the surface of the second pad 122 have been formed on the circuit substrate 110.

Next, a plurality of light-emitting elements 130 (including light-emitting element 130A, light-emitting element 130B and light-emitting element 130C) can be transferred onto the circuit substrate 110 through the mass transfer process MT, so that the first electrode 131 of the light-emitting element 130 is located on the first pad 121, and the connection pattern 140' is adjacent to one side of the light-emitting element 130. In some embodiments, the connection pattern 140' surrounds the light-emitting element 130. In some embodiments, the connection pattern 140' does not contact the light-emitting element 130.

Next, a heat treatment, such as infrared laser treatment, is performed so that the first electrode 131 is thermally melted and attached to the first pad 121, and the connection pattern 140' is thermally melted to extend to the second electrode 132 and adhere to the second electrode 132, thereby forming the connector 140, as shown in FIG. 1C. Accordingly, the first electrode 131 can be electrically connected to the first pad 121, and the second electrode 132 can be electrically connected to the second pad 122 through the connector 140. In some embodiments, the insulating layer 134 is attached to the second pad 122 to avoid the electrical connection between the connector 140 and the first electrode 131. In some embodiments, the first electrode 131 is physically connected to the first pad 121. In some embodiments, the first electrode 131 further extends to outside of the first pad 121 after being thermally melted. In some embodiments, the first electrodes 131 can cover the first pads 121 after being melted. In some embodiments, the connection pattern 140' further extends to outside of the second pad 122 after being melted.

Figure 2A:
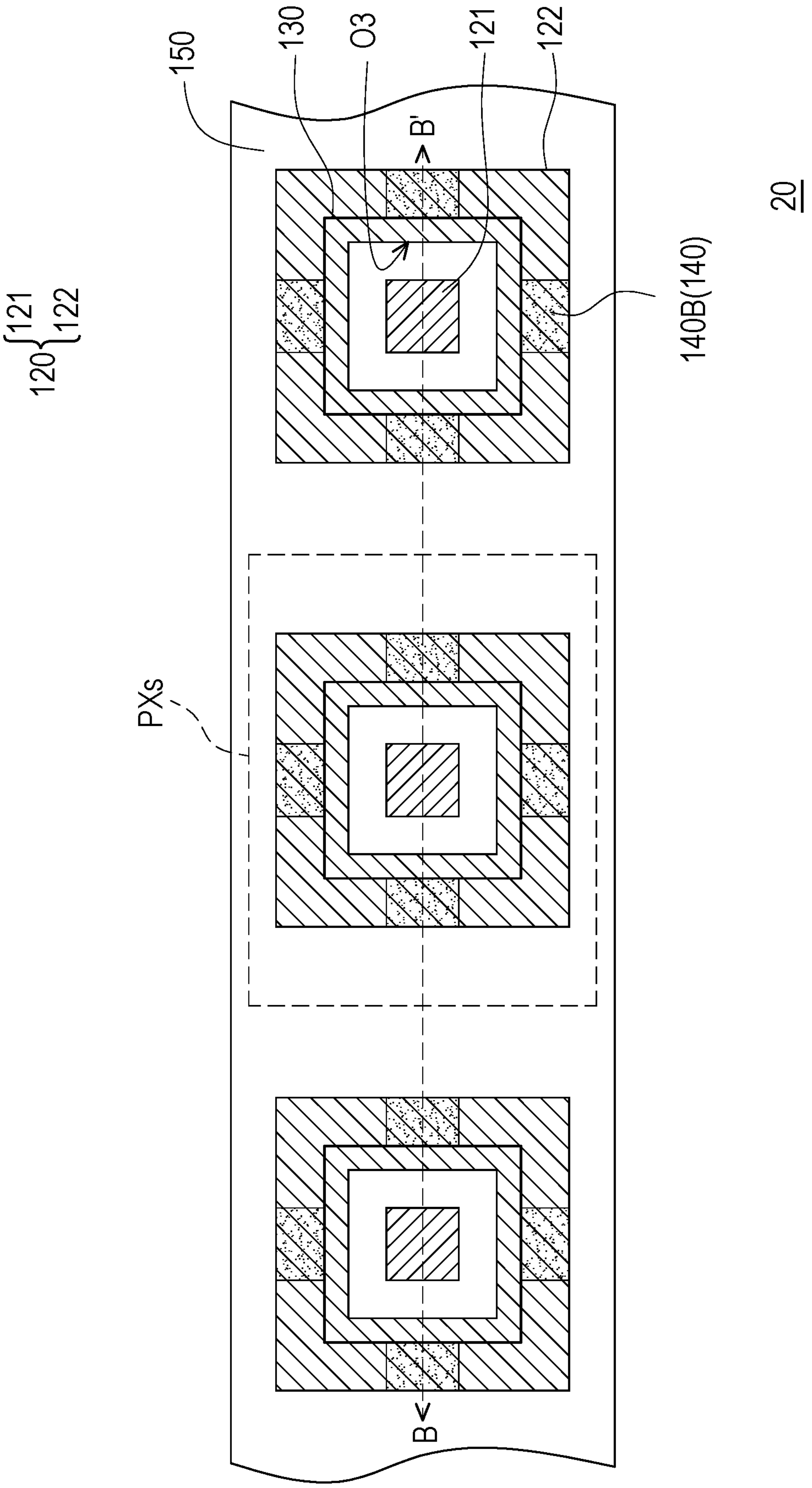
FIG. 2A is a schematic partial top view of a display device 20 according to an embodiment of the disclosure.
Figure 2B:
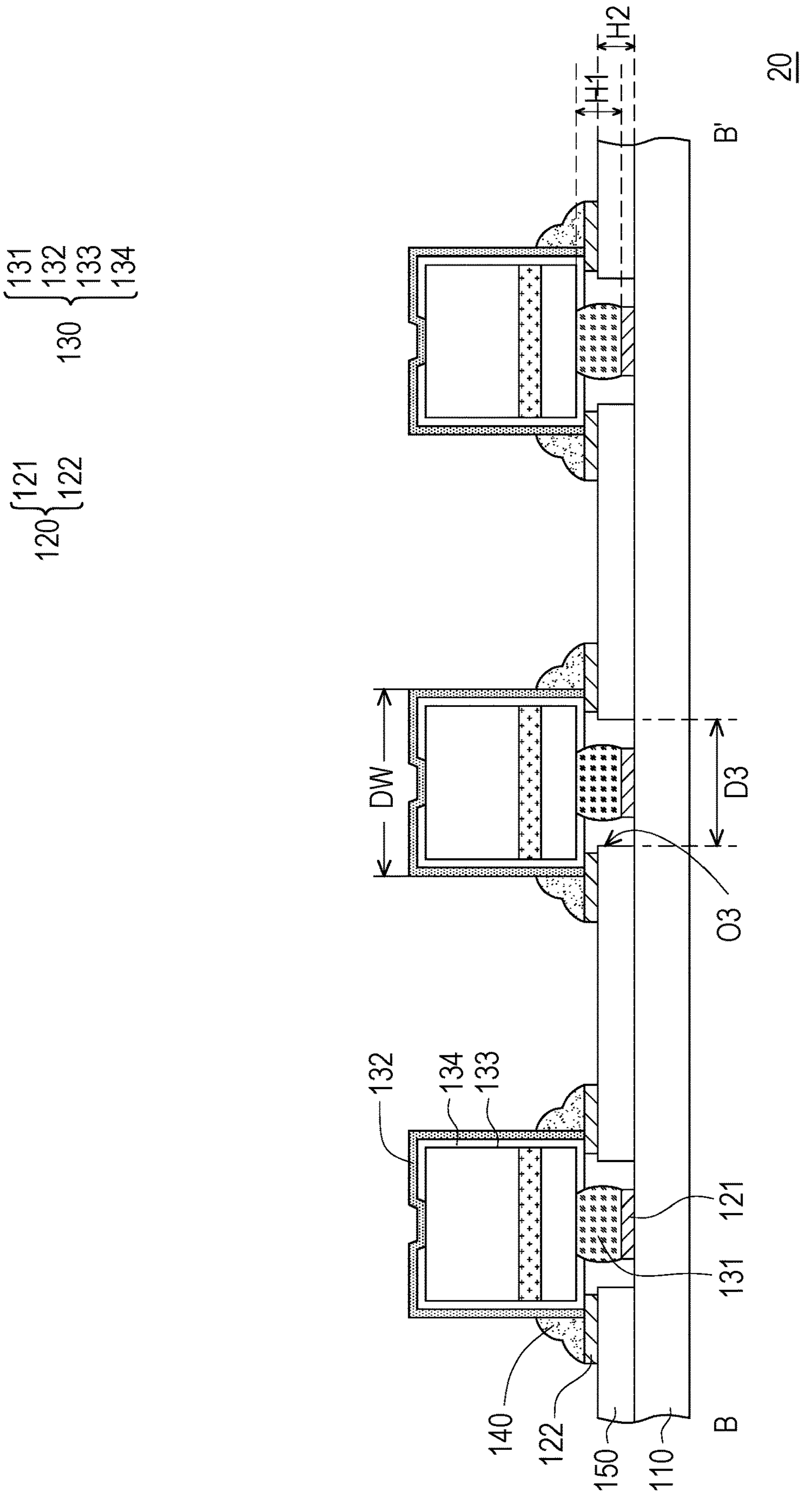
FIG. 2B is a schematic cross-sectional view taken along the section line B-B' of FIG. 2A.

FIG. 2A is a schematic partial top view of a display device 20 according to an embodiment of the disclosure. FIG. 2B is a schematic cross-sectional view taken along the section line B-B' of FIG. 2A. The display device 20 includes: a circuit substrate 110; a plurality of pad sets 120 disposed on the circuit substrate 110, and each pad set 120 includes a first pad 121 and a second pad 122 surrounding the first pad 121; a plurality of light-emitting elements 130 disposed on the circuit substrate 110, and each light-emitting element 130 includes a first electrode 131, a second electrode 132 and a light-emitting stack 133 sandwiched between the first electrode 131 and the second electrode 132; and connectors 140, wherein the first electrode 131 is electrically connected to the first pad 121, and the second electrode 132 is electrically connected to the second pad 122 through the connector 140.

Compared with the display device 10 as shown in FIG. 1A to FIG. 1C, the display device 20 shown in FIG. 2A to FIG. 2B is mainly different in that the display device 20 further includes a planarization layer 150 between the second pad 122 and the circuit substrate 110. The planarization layer 150 has a plurality of openings O3, and the first pads 121 of the plurality of pad sets 120 are disposed in the plurality of openings O3 respectively.

In some embodiments, the insulating layer 134 is attached to the second pad 122 to prevent the connector 140 from entering the opening O3, thereby avoiding the electrical connection between the connector 140 and the first electrode 131. In some embodiments, the dimension DW of the light-emitting element 130 is not less than the diameter D3 of the opening O3, i.e. the dimension DW≥the diameter D3, so as to prevent the second electrode 132 from being electrically connected to the first electrode 131 after the heat treatment. In some embodiments, the height H1 of the first electrode 131 is greater than the height H2 of the planarization layer 150. In some embodiments, the height H1 of the first electrode 131 approximates or substantially equals the height H2 of the planarization layer 150. In some embodiments, the material of the planarization layer 150 may include transparent insulating materials, such as organic materials, acrylic materials, siloxane materials, polyimide materials, epoxy resin materials, etc.

In some embodiments, the connector 140 includes a plurality of connection segments 140B, and the connection segments 140B are separated from each other. In some embodiments, the connection segments 140B are disposed respectively at different sides of the light-emitting element 130, and the connection segments 140B are electrically connected to portions of the second electrode 132 located at different sides of the light-emitting element 130 respectively.

Figure 3:
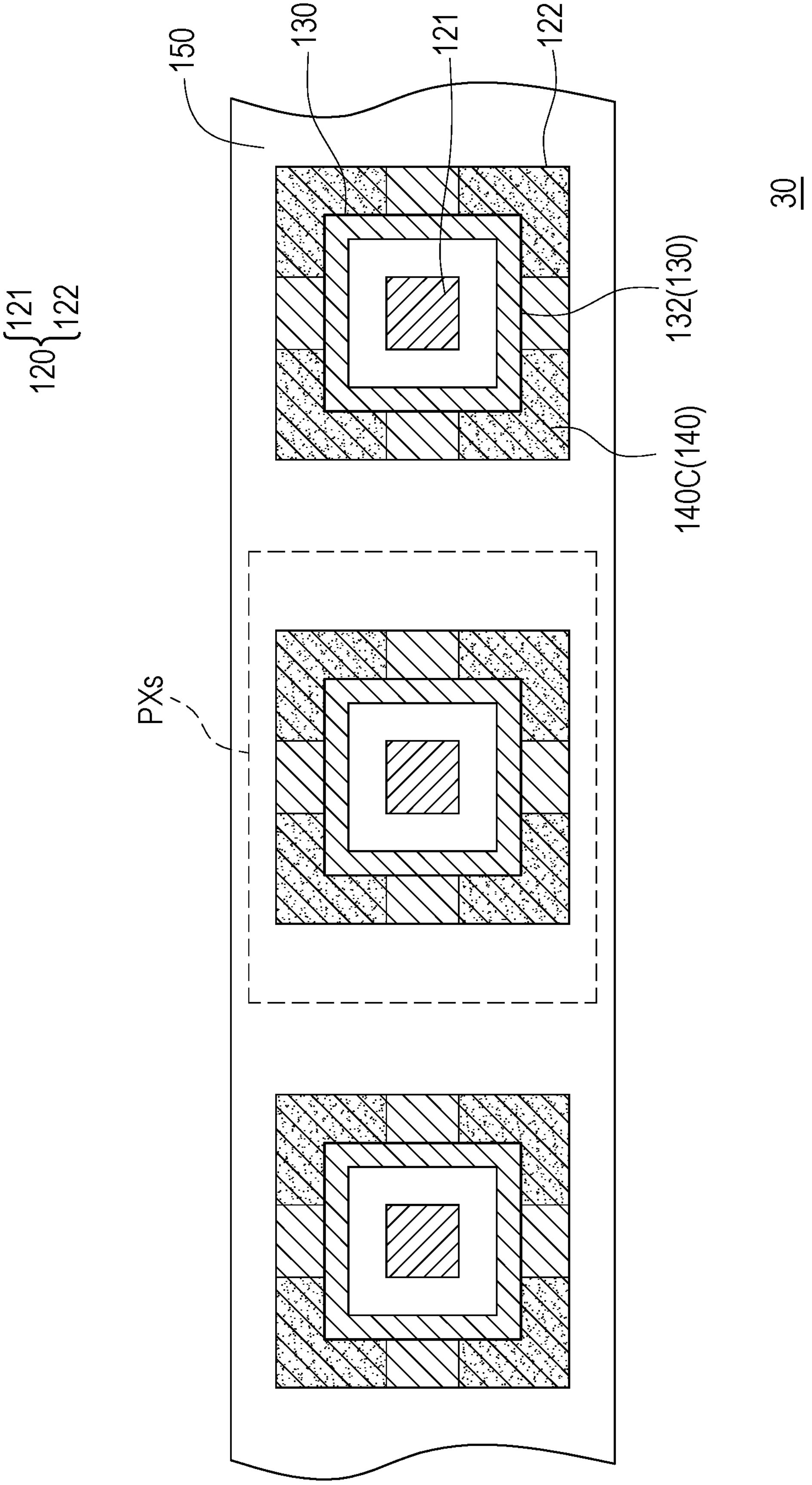
FIG. 3 is a schematic partial top view of a display device 30 according to an embodiment of the disclosure.

FIG. 3 is a schematic partial top view of a display device 30 according to an embodiment of the disclosure. The display device 30 includes a plurality of sub-pixels PXs, a plurality of pad sets 120, a plurality of light-emitting elements 130, a plurality of connectors 140 and a planarization layer 150. Compared with the display device 20 as shown in FIG. 2A to FIG. 2B, the display device 30 shown in FIG. 3 is mainly different in that the connector 140 includes a plurality of connection segments 140C, the connection segments 140C are separated from each other, and the connection segments 140C can be electrically connected to portions of the second electrode 132 located at different corners of the light-emitting element 130 respectively.

Figure 4:
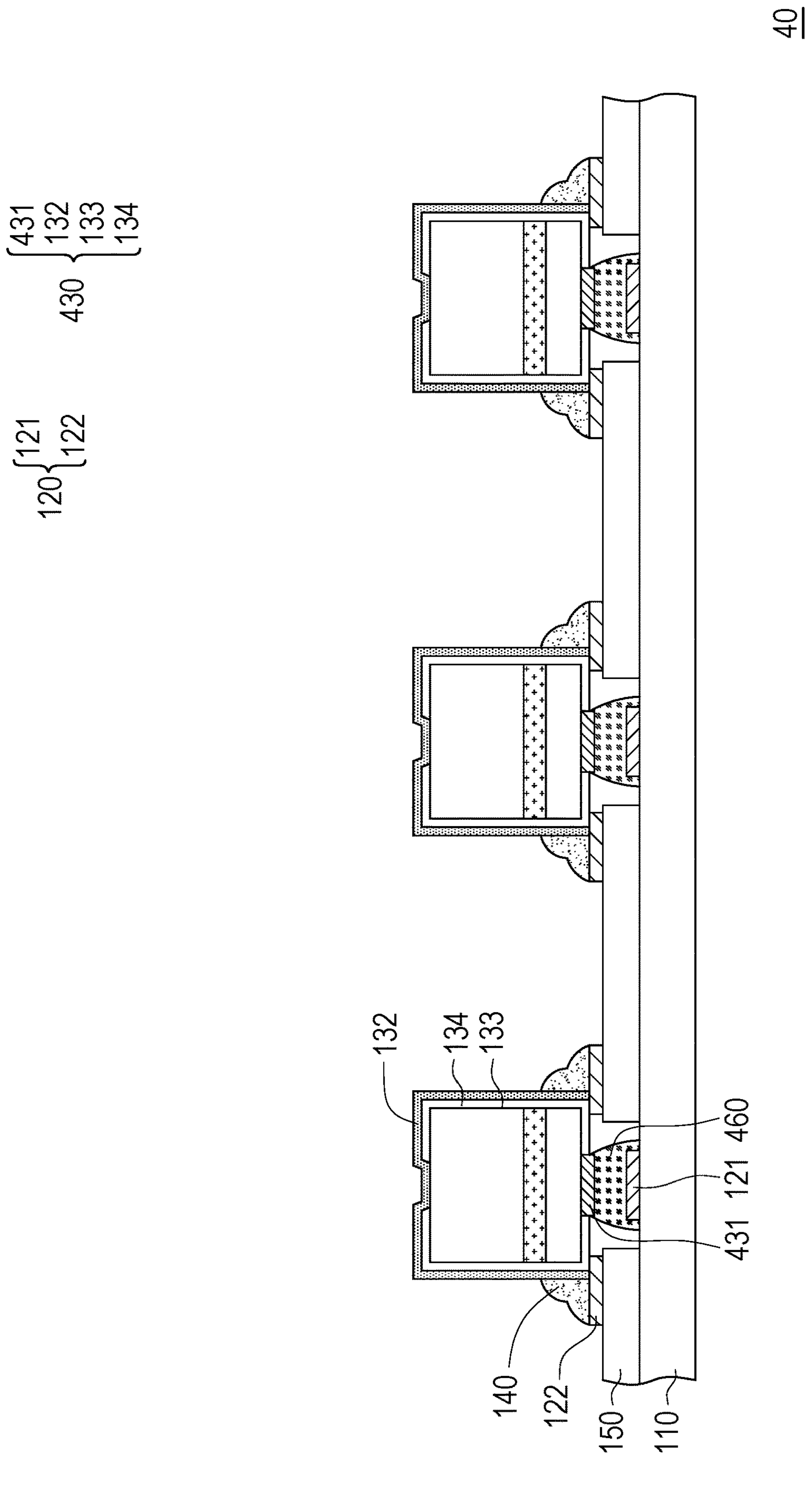
FIG. 4 is a schematic partial cross-sectional view of a display device 40 according to an embodiment of the disclosure.

FIG. 4 is a schematic partial cross-sectional view of a display device 40 according to an embodiment of the disclosure. The display device 40 includes a circuit substrate 110, a plurality of pad sets 120, a plurality of light-emitting elements 430, connectors 140 and a planarization layer 150. The plurality of pad sets 120 is disposed on the circuit substrate 110, and each pad set 120 includes a first pad 121 and a second pad 122, wherein the second pad 122 surrounds the first pad 121. The plurality of light-emitting elements 430 is disposed above the circuit substrate 110, and each light-emitting element 430 includes a first electrode 431, a second electrode 132, a light-emitting stack 133 and an insulating layer 134, wherein the light-emitting stack 133 is sandwiched between the first electrode 431 and the second electrode 132, and the insulating layer 134 is located between the second electrode 132 and the light-emitting stack 133.

Compared with the display device 20 as shown in FIG. 2A to FIG. 2B, the display device 40 shown in FIG. 4 is mainly different in that the first electrode 431 of the light-emitting element 430 includes materials that are not melted by the heat treatment (e.g., infrared laser treatment). For example, the material of the first electrode 431 includes gold (Au) or nickel-gold (NiAu) alloy.

In this embodiment, the display device 40 further includes a connector 460 located between the first electrode 431 and the first pad 121, and the connector 460 electrically connects the first electrode 431 to the first pad 121. In some embodiments, the material of the connector 460 includes solder. In some embodiments, the material of the connector 460 includes tin.

Figure 5A:
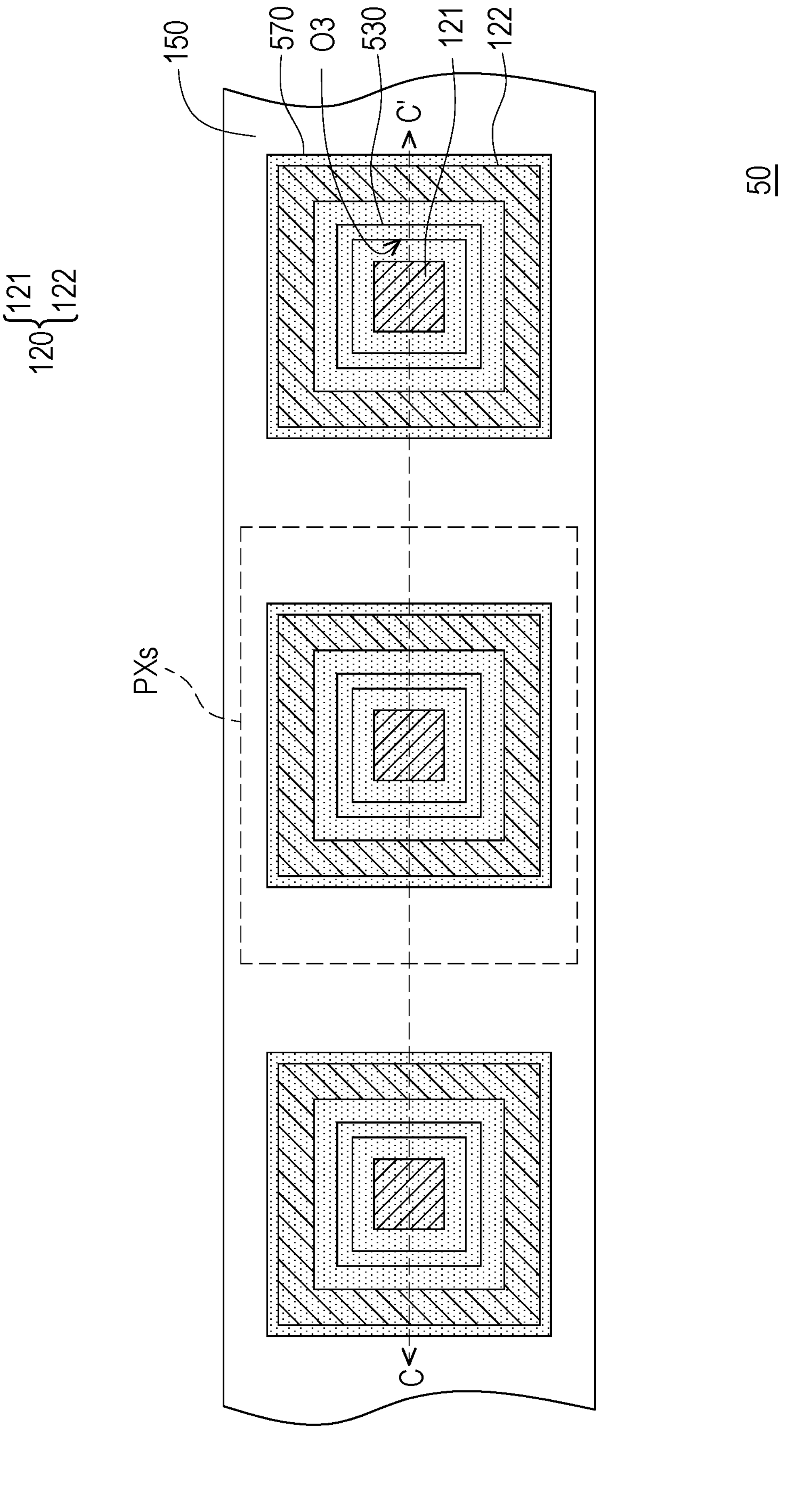
FIG. 5A is a schematic partial top view of a display device 50 according to an embodiment of the disclosure.
Figure 5B:
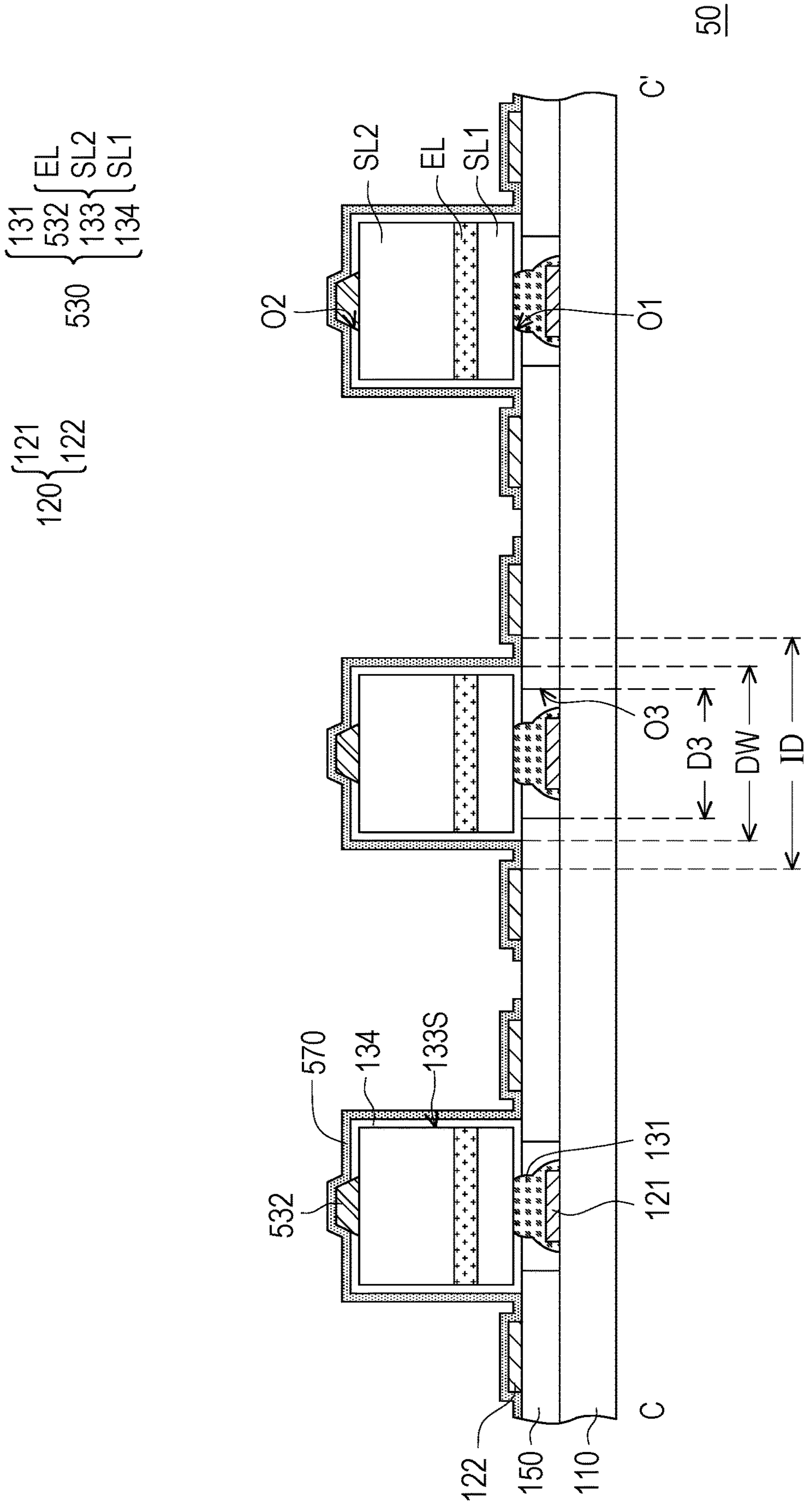
FIG. 5B is a schematic cross-sectional view taken along the section line C-C' of FIG. 5A.

FIG. 5A is a schematic partial top view of a display device 50 according to an embodiment of the disclosure. FIG. 5B is a schematic cross-sectional view taken along the section line C-C' of FIG. 5A. The display device 50 includes a circuit substrate 110, a plurality of pad sets 120, a plurality of light-emitting elements 530, and a planarization layer 150. The plurality of pad sets 120 is disposed on the circuit substrate 110, and each pad set 120 includes a first pad 121 and a second pad 122, wherein the second pad 122 surrounds the first pad 121. The plurality of light-emitting elements 530 is disposed on the circuit substrate 110, and each light-emitting element 530 includes a first electrode 131, a second electrode 532, a light-emitting stack 133 and an insulating layer 134, wherein the light-emitting stack 133 is sandwiched between the first electrode 131 and the second electrode 532, and the insulating layer 134 covers the light-emitting stack 133 and has opening O1 and opening O2. The light-emitting stack 133 includes a semiconductor layer SL1, a semiconductor layer SL2 and a light-emitting layer EL, and the light-emitting layer EL is sandwiched between the semiconductor layer SL1 and the semiconductor layer SL2. The semiconductor layer SL1 of the light-emitting stack 133 is exposed through the opening O1, and the first electrode 131 is electrically connected to the semiconductor layer SL1 through the opening O1. The semiconductor layer SL2 of the light-emitting stack 133 is exposed through the opening O2, and the second electrode 532 is electrically connected to the semiconductor layer SL2 through the opening O2. The first electrode 131 is electrically connected to the first pad 121, and the second electrode 532 is electrically connected to the second pad 122. The planarization layer 150 has a plurality of openings O3, and the first pads 121 of the plurality of pad sets 120 are disposed in the plurality of openings O3 respectively.

Compared with the display device 20 as shown in FIG. 2A to FIG. 2B, the display device 50 shown in FIG. 5 is mainly different in that the display device 50 does not include the connector 140, and the second electrode 532 of the light-emitting element 530 of the display device 50 is only disposed in the opening O2 of the insulating layer 134. In other words, the second electrode 532 of the light-emitting element 530 is only disposed on the top surface 133T of the light-emitting stack 133, and the second electrode 532 of the light-emitting element 530 does not extend to the sidewall 133S of the light-emitting stack 133.

In this embodiment, the display device 50 further includes a transparent conductive layer 570, the transparent conductive layer 570 covers the top surface of the second electrode 532 of the light-emitting element 530 and the sidewall 133S of the light-emitting stack 133, and the transparent conductive layer 570 electrically connects the second electrode 532 and the second pad 122 of the pad set 120. In some embodiments, the second electrode 532 includes a material that has low contact resistance with the transparent conductive layer 570. For example, the material of the second electrode 532 is tin, gold, silver (Ag) or copper (Cu). In some embodiments, in each sub-pixel PXs, the transparent conductive layer 570 completely covers the pad set 120 and the light-emitting element 530. Accordingly, even if the etching process is used to pattern the transparent conductive layer 570, the electrical connection between the pad set 120 and the light-emitting element 530 will not be damaged by the etching process.

In some embodiments, the transparent conductive layer 570 in each sub-pixel PXs is separated from the transparent conductive layer 570 in adjacent sub-pixel PXs. In some embodiments, the transparent conductive layer 570 in each sub-pixel PXs has a different potential. In some embodiments, the transparent conductive layer 570 further extends to a side of the second pad 122 away from the light-emitting element 530. The material of the transparent conductive layer 570 may include indium tin oxide (InSnO), indium zinc oxide (InZnO), aluminum tin oxide (AlSnO), aluminum zinc oxide (A1ZnO), indium gallium zinc oxide (InGaZnO), nano silver or other suitable conductive oxides.

In this embodiment, the dimension DW of the light-emitting element 530 is smaller than the inner diameter ID of the second pad 122, but the disclosure is not limited thereto. In some embodiments, the dimension DW of the light-emitting element 530 is equal to the inner diameter ID of the second pad 122. In some embodiments, the dimension DW of the light-emitting element 530 is greater than the inner diameter ID of the second pad 122. In some embodiments, the dimension DW of the light-emitting element 530 is greater than or equal to the diameter D3 of the opening O3 to prevent the transparent conductive layer 570 from entering the opening O3 and to avoid the formation of electrical connection between the transparent conductive layer 570 and the first electrode 131 of the light-emitting element 530.

Figure 6:
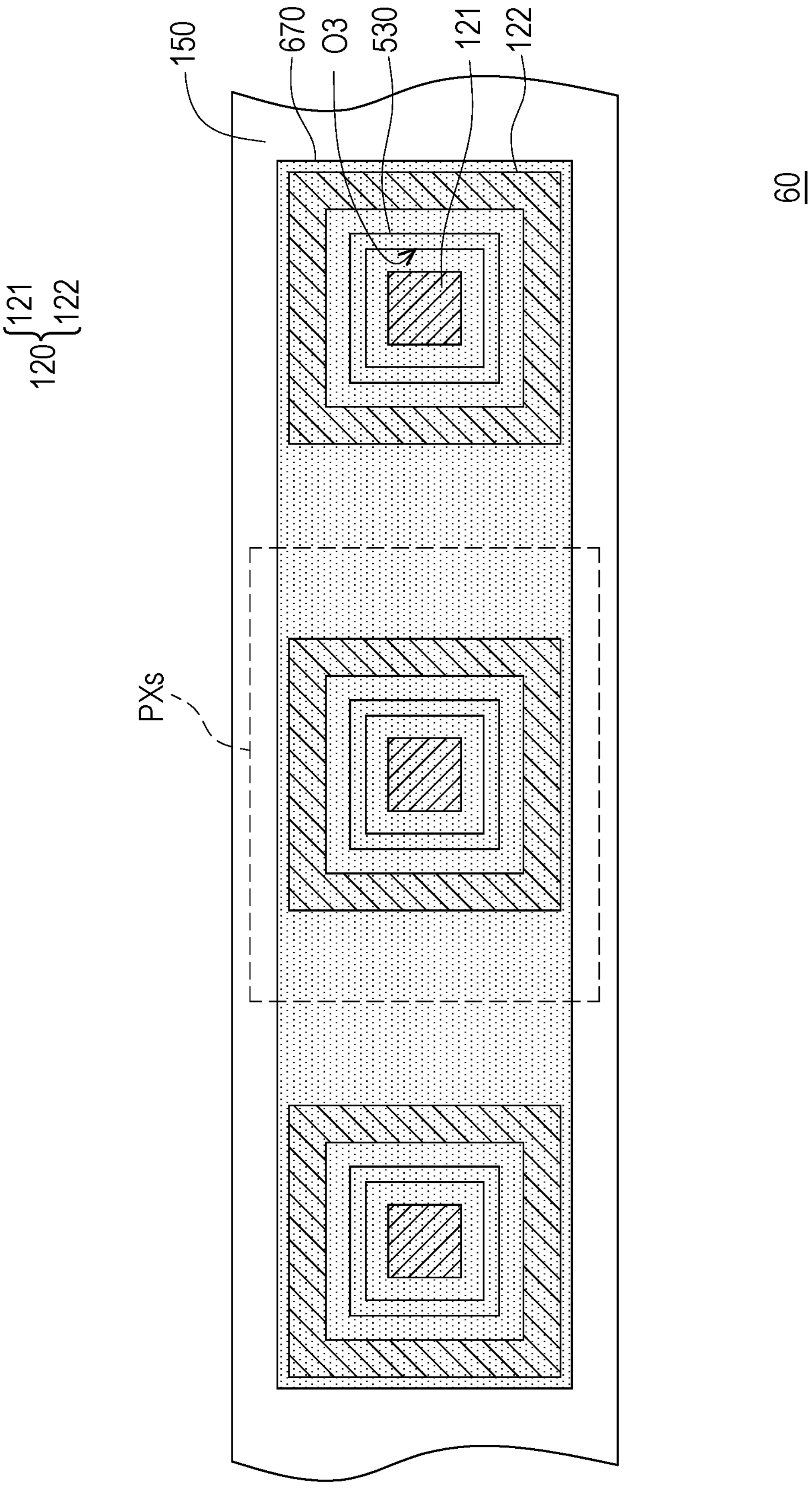
FIG. 6 is a schematic partial top view of a display device 60 according to an embodiment of the disclosure.

FIG. 6 is a schematic partial top view of a display device 60 according to an embodiment of the disclosure. The display device 60 includes a plurality of pad sets 120, a plurality of light-emitting elements 530, a planarization layer 150 having a plurality of openings O3, and a transparent conductive layer 670. Compared with the display device 50 as shown in FIG. 5A to FIG. 5B, the display device 60 shown in FIG. 6 is mainly different in that the transparent conductive layer 670 in each sub-pixel PXs of the display device 60 is connected to the transparent conductive layer 670 in adjacent sub-pixel PXs. In other words, the transparent conductive layer 670 can serve as a flat electrode, and the transparent conductive layer 670 in each sub-pixel PXs has the same potential. Accordingly, the transparent conductive layer 670 need not proceed with the patterning process, such as the etching process.

Figure 7:
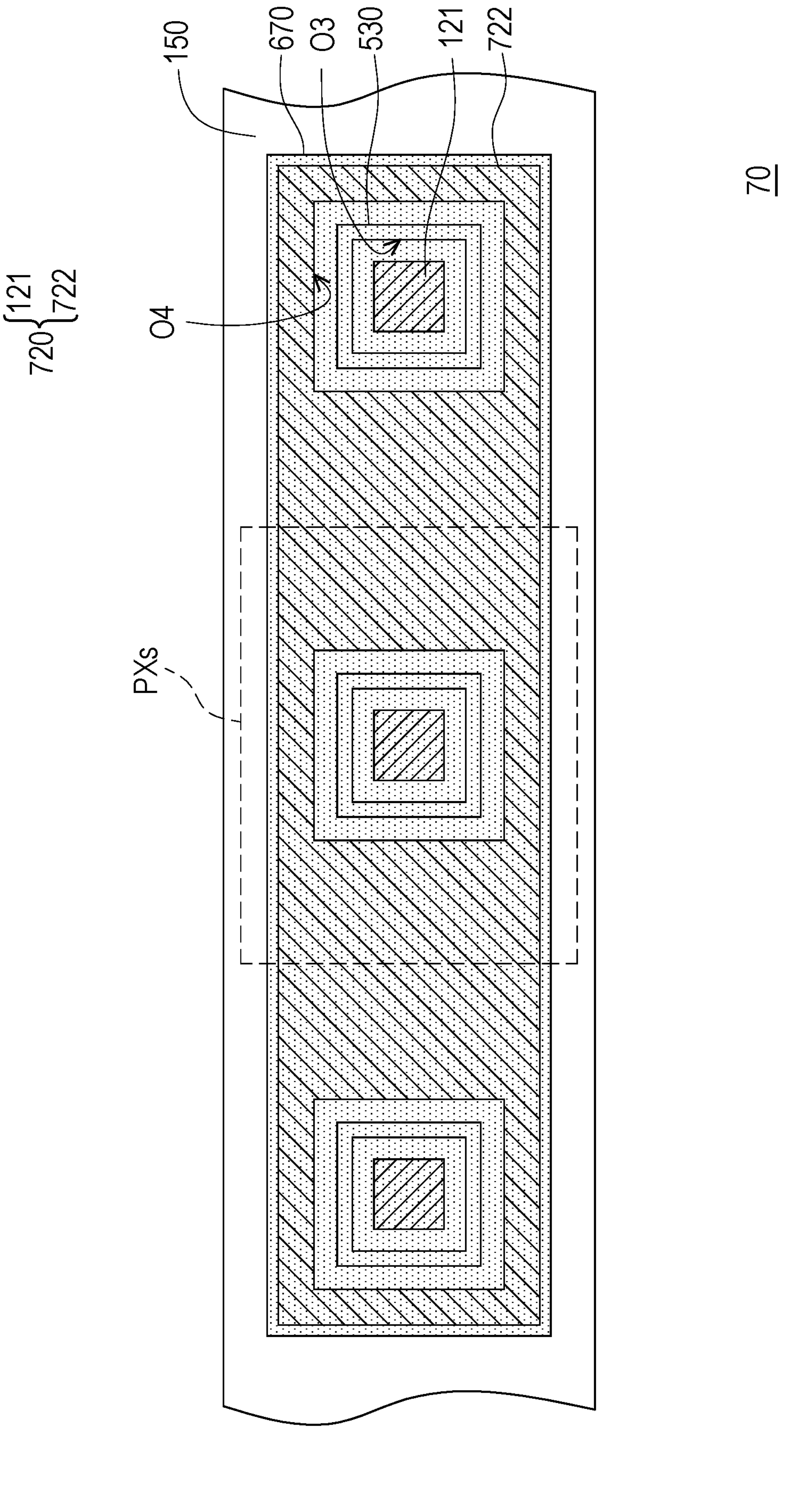
FIG. 7 is a schematic partial top view of a display device 70 according to an embodiment of the disclosure.

FIG. 7 is a schematic partial top view of a display device 70 according to an embodiment of the disclosure. The display device 70 includes plural pad sets 720, plural light-emitting elements 530, a planarization layer 150 having plural openings O3, and a transparent conductive layer 670. Compared with the display device 60 as shown in FIG. 6, the display device 70 shown in FIG. 7 is mainly different in that the pad set 720 in each sub-pixel PXs of the display device 70 includes the first pad 121 and the second pad 722, and the second pads 722 of the pad sets 720 are electrically connected to each other. In some embodiments, the second pads 722 of the pad sets 720 are physically connected to each other. In some embodiments, the second pads 722 may constitute a flat electrode having plural openings O4, and the light-emitting elements 530 are located in the openings O4 respectively.

In summary, in the display device of the disclosure, by making the second pad surround the first pad, the process for electrically connecting the second electrode and the second pad can be accomplished using heat treatment, so that the damage to the electrical connection between the first electrode and the first pad caused by the etching process can be avoided, thereby improving the reliability of the display device. In addition, for the display device of the disclosure, the patterning process can be carried out after the transparent conductive layer completely covers the pad set and the light-emitting element, which can also avoid the damage to the electrical connection between the pad set and the light-emitting element caused by the etching process.

Although the disclosure has been described in detail with reference to the above embodiments, the embodiments are not intended to limit the disclosure. Those skilled in the art should understand that it is possible to make changes and modifications without departing from the spirit and scope of the disclosure. Therefore, the protection scope of the disclosure shall be defined by the appended claims.

What is claimed is:

1. A display device, comprising:

a circuit substrate;

a plurality of pad sets, disposed on the circuit substrate, and each pad set including:

a first pad; and a second pad surrounding the first pad; and a plurality of light-emitting elements, disposed above the circuit substrate, and each light-emitting element including a first electrode, a second electrode and a light-emitting stack between the first electrode and the second electrode;

wherein the first electrode is electrically connected to the first pad, the second electrode is electrically connected to the second pad, and an orthographic projection of the second electrode on the circuit substrate is overlapped with an orthographic projection of the first pad on the circuit substrate, wherein a vertical spacing between the second pad and the circuit substrate is greater than a vertical spacing between the first pad and the circuit substrate in a cross-sectional view cut through the first pad, the second pad and the circuit substrate;

further comprising:

a transparent conductive layer electrically connecting the second electrode to the second pad, wherein the first electrode is disposed between the first pad and a bottom surface of the light-emitting stack, the second electrode is disposed between a top surface of the light-emitting stack and the transparent conductive layer, the transparent conductive layer covers the top surface and a sidewall of the light-emitting stack without touching the bottom surface of the light-emitting stack, and the sidewall of the light-emitting stack connects the top surface of the light-emitting stack to the bottom surface of the light-emitting stack; and a planarization layer disposed between the second pads of the plurality of pad sets and the circuit substrate and having a plurality of openings, wherein the first pads of the plurality of pad sets are disposed in the plurality of openings respectively, and the second pads of the plurality of pad sets are disposed on the planarization layer.

2. The display device according to claim 1, wherein the first electrode is disposed between the first pad and the light-emitting stack, the second electrode extends from a top surface of the light-emitting stack to a sidewall of the light-emitting stack without touching a bottom surface of the light-emitting stack facing the first pad.

3. The display device according to claim 1, further comprising an insulating layer disposed between the transparent conductive layer and the sidewall of the light-emitting stack, wherein the insulating layer combined with the planarization layer separate the first electrode from touching the transparent conductive layer.

* * * * *